United States Patent
Kim et al.

(10) Patent No.: US 11,444,146 B2
(45) Date of Patent: Sep. 13, 2022

(54) DISPLAY DEVICE AND METHOD FOR MANUFACTURING THE SAME

(71) Applicant: Samsung Display Co., LTD., Yongin-si (KR)

(72) Inventors: Byoungyong Kim, Seoul (KR); Seok-Hyun Nam, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 109 days.

(21) Appl. No.: 16/908,986

(22) Filed: Jun. 23, 2020

(65) Prior Publication Data
US 2020/0411630 A1 Dec. 31, 2020

(30) Foreign Application Priority Data

Jun. 28, 2019 (KR) .......................... 10-2019-0078370

(51) Int. Cl.
*H01L 25/18* (2006.01)
*H01L 27/32* (2006.01)
*H01L 23/00* (2006.01)

(52) U.S. Cl.
CPC .......... *H01L 27/3279* (2013.01); *H01L 24/03* (2013.01); *H01L 24/16* (2013.01); *H01L 24/32* (2013.01); *H01L 25/18* (2013.01); *H01L 2224/16225* (2013.01); *H01L 2224/32225* (2013.01)

(58) Field of Classification Search
None
See application file for complete search history.

(56) References Cited

U.S. PATENT DOCUMENTS

| | | | | |
|---|---|---|---|---|
| 9,281,494 B2* | 3/2016 | Lee | .................... | H01L 27/3276 |
| 9,293,482 B2* | 3/2016 | Kim | .................... | H01L 27/3276 |
| 9,632,381 B2* | 4/2017 | Kang | .................... | G02F 1/1339 |
| 10,170,462 B2* | 1/2019 | Choi | .................. | G02F 1/133512 |
| 10,564,484 B2* | 2/2020 | Jeon | .................... | G02F 1/13452 |
| 10,725,348 B2* | 7/2020 | Song | .................... | H01L 27/3276 |
| 10,838,532 B2* | 11/2020 | Abe | .................... | G06F 3/0416 |
| 2015/0053931 A1* | 2/2015 | Kim | .................... | H01L 27/3276 257/40 |
| 2016/0377905 A1* | 12/2016 | Choi | ...................... | H01L 24/32 257/72 |
| 2017/0005083 A1* | 1/2017 | Choi | .................. | G02F 1/13458 |
| 2017/0357121 A1* | 12/2017 | Cho | ...................... | G02F 1/1368 |
| 2017/0358602 A1* | 12/2017 | Bae | .................... | G02F 1/13458 |
| 2018/0063970 A1* | 3/2018 | Ha | ...................... | H05K 5/0017 |

(Continued)

FOREIGN PATENT DOCUMENTS

EP 3112931 A1 * 1/2017 ....... G02F 1/133308

*Primary Examiner* — Telly D Green
(74) *Attorney, Agent, or Firm* — Cantor Colburn LLP

(57) ABSTRACT

A display device includes: a display panel including a pixel array, a side terminal including a side surface which is exposed to outside the display panel, and a transfer wiring electrically connecting the side terminal and the pixel array to each other; and a side pad which is conductive and through which an electrical signal is provided to the side terminal from outside the display panel, the side pad contacting the display panel at the side surface of the side terminal which is exposed to outside the display panel. An end of the transfer wiring is spaced apart from the side surface of the side terminal which is exposed to outside the display panel.

13 Claims, 15 Drawing Sheets

(56) References Cited

U.S. PATENT DOCUMENTS

| | | | |
|---|---|---|---|
| 2018/0292687 A1* | 10/2018 | Jeon | G02F 1/1339 |
| 2019/0018274 A1 | 1/2019 | Baek et al. | |
| 2019/0019646 A1 | 1/2019 | Nutzel | |
| 2019/0019816 A1 | 1/2019 | Kang et al. | |
| 2019/0094633 A1* | 3/2019 | Song | H01L 27/3276 |
| 2019/0204638 A1* | 7/2019 | Park | G02F 1/1333 |
| 2021/0066435 A1* | 3/2021 | Ryu | H01L 51/5246 |
| 2021/0111238 A1* | 4/2021 | Kim | H01L 27/3276 |

* cited by examiner

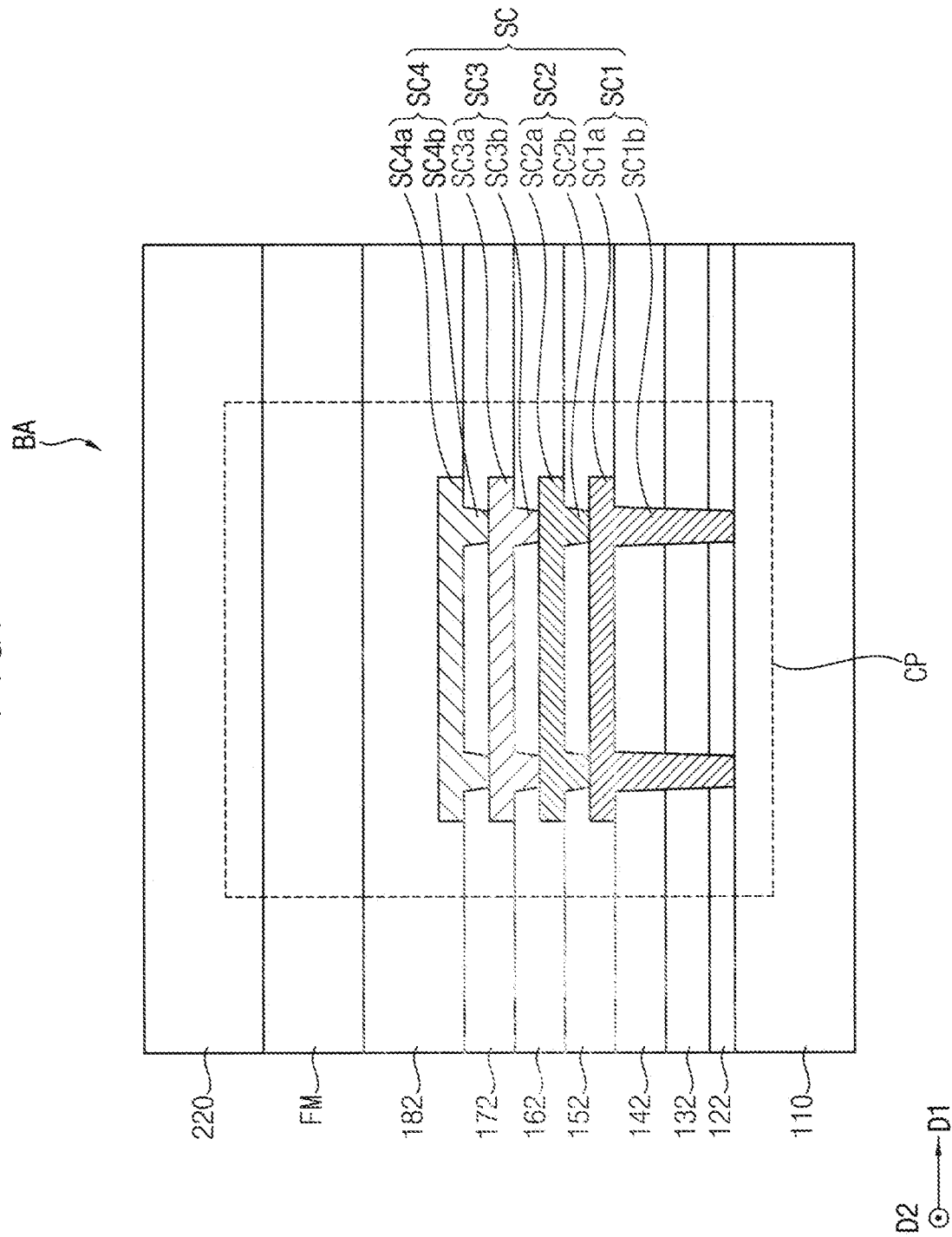

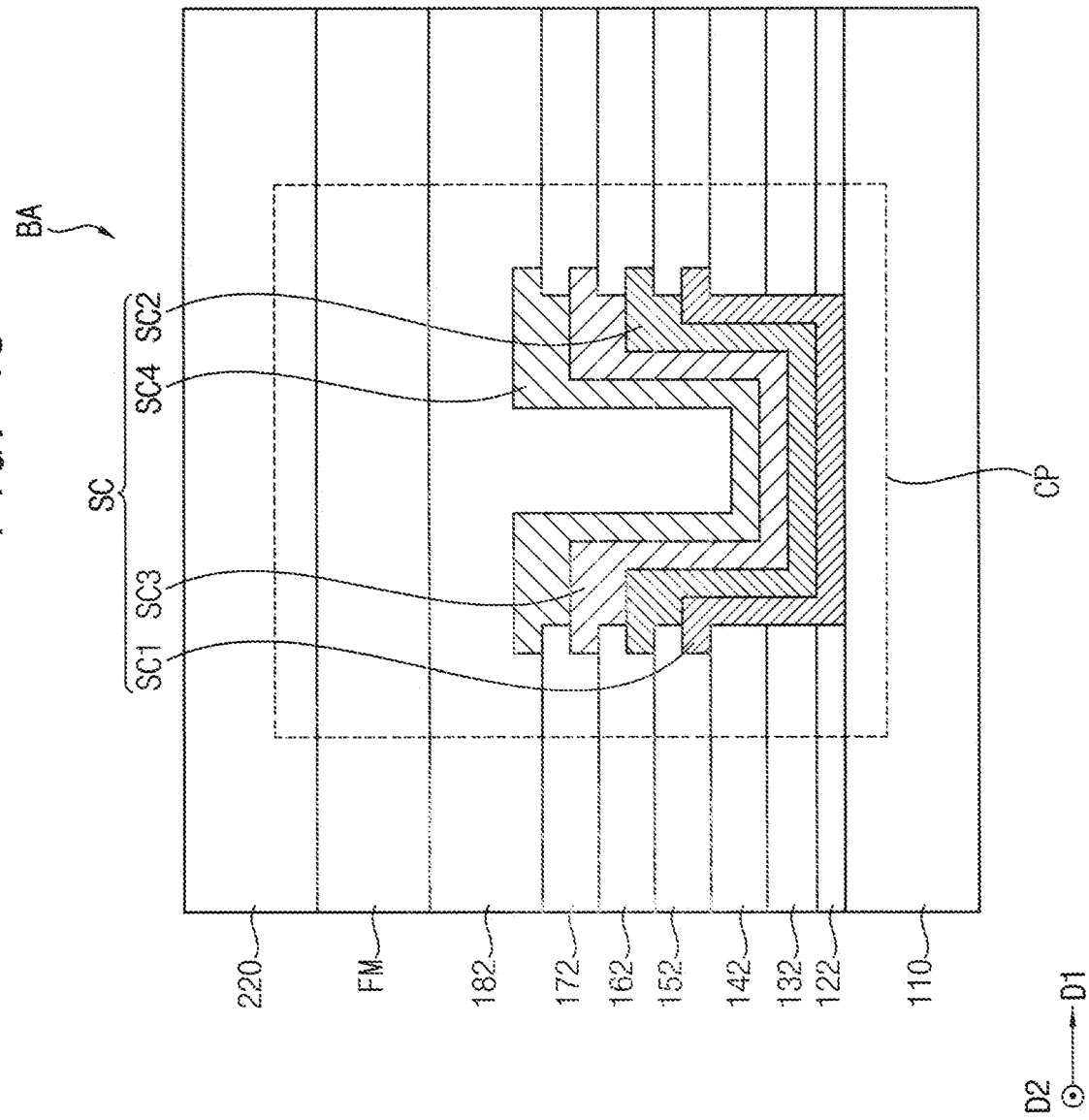

DISPLAY DEVICE AND METHOD FOR MANUFACTURING THE SAME

This application claims priority to Korean Patent Application No. 10-2019-0078370 filed on Jun. 28, 2019, and all the benefits accruing therefrom under 35 U.S.C. § 119, the entire disclosure of which is incorporated by reference herein in its entirety.

BACKGROUND

1. Field

Embodiments relate to a display device. More particularly, embodiments relate to a display device and a method for manufacturing the same.

2. Description of the Related Art

A display device includes a display panel and a driver which provides a driving signal to the display panel. The driver may be included in a driving chip. The driving chip may be combined directly with a substrate of the display panel, or may be connected to a pad part of the display panel through a flexible printed circuit board or the like.

SUMMARY

Embodiments provide a display device having a reduced bezel and improved reliability.

Embodiments provide a method for manufacturing the display device.

According to an embodiment, a display device includes a display panel including a pixel array, a side terminal including a side surface which is exposed to outside the display panel, and a transfer wiring electrically connecting the side terminal and the pixel array to each other; and a side pad which is conductive and through which an electrical signal is provided to the side terminal from outside the display panel, the side pad contacting the display panel at the side surface of the side terminal which is exposed to outside the display panel. An end of the transfer wiring is spaced apart from the side surface of the side terminal which is exposed to outside the display panel.

In an embodiment, the side terminal may include at least two conductive layers.

In an embodiment, the side terminal may include a first conductive layer and a second conductive layer disposed on the first conductive layer.

In an embodiment, the first conductive layer may contact the transfer wiring, and the second conductive layer may contact the first conductive layer.

In an embodiment, the first and second conductive layers may each contact the transfer wiring.

In an embodiment, the side terminal may include a first conductive layer disposed under the transfer wiring and a second conductive layer disposed on the transfer wiring.

In an embodiment, the side terminal may include, at a contact surface of the side pad and the side terminal, a horizontal extending portion extending in a horizontal direction and a vertical extending portion extending along a side surface of an insulation layer adjacent to the side terminal.

In an embodiment, the side terminal may include, at the contact surface of the side pad and the side terminal, a conformal shape extending along a bottom of an opening and a side surface of an insulation layer at the opening.

In an embodiment, the display panel may further include an array substrate including each of the pixel array, the side terminal and the transfer wiring, on a base substrate, a cover substrate combined with the array substrate, a sealing member disposed between the array substrate and the cover substrate to encapsulate the pixel array, and a filling member disposed between the cover substrate and the side terminal.

In an embodiment, the filling member may include a cured resin.

In an embodiment, the display device may further include an external driving device bonded to the side pad. The external driving device may provide a driving signal or a power (e.g., an electrical signal) to the transfer wiring, through the side pad and the side terminal.

In an embodiment, the external driving device may include a flexible printed circuit board on which a driving chip is mounted.

In an embodiment, the pixel array may include an organic light-emitting diode.

According to an embodiment, a method for manufacturing a display device includes providing a display panel including a pixel array, a side terminal including a side surface which is closest to an end of the display panel, and a transfer wiring electrically connecting the pixel array and the side terminal to each other, exposing the side surface of the side terminal to outside the display panel, providing a side pad which is conductive and through which an electrical signal is provided to the side terminal from outside the display panel, the side pad contacting the side surface of the side terminal which is exposed to outside the display panel, and providing an external driving device from which the electrical signal is provided from outside the display panel, to the side pad, the external driving device being connected to the side pad. Within the display panel, an end of the transfer wiring is spaced apart from the side surface of the side terminal which is exposed to outside the display panel.

According to embodiments, a display panel may be bonded to an external driving device, at an exposed side surface of a side terminal of the display panel, thereby reducing a size of a peripheral area or a bezel of the display panel.

Furthermore, a transfer wiring within the display panel is covered and not exposed to outside the display panel at the side surface thereof, and is electrically connected to a side pad outside the display panel through a side terminal which is exposed to outside the display panel. Thus, damage to the transfer wiring, which may be caused in processing the side surface of the display panel in exposing the side terminal to outside the display panel, may be reduced or effectively prevented.

Furthermore, since the side terminal includes a plurality of conductive layers which are exposed to outside the display panel, a contact area of the side terminal with the side pad may be increased.

BRIEF DESCRIPTION OF THE DRAWINGS

The above and other advantages and features of the invention will be more clearly understood from the following detailed description taken in conjunction with the accompanying drawings.

FIGS. 14 and 15 are lateral enlarged cross-sectional views illustrating embodiments of a bonding area of a display device.

DETAILED DESCRIPTION

Figure 1:
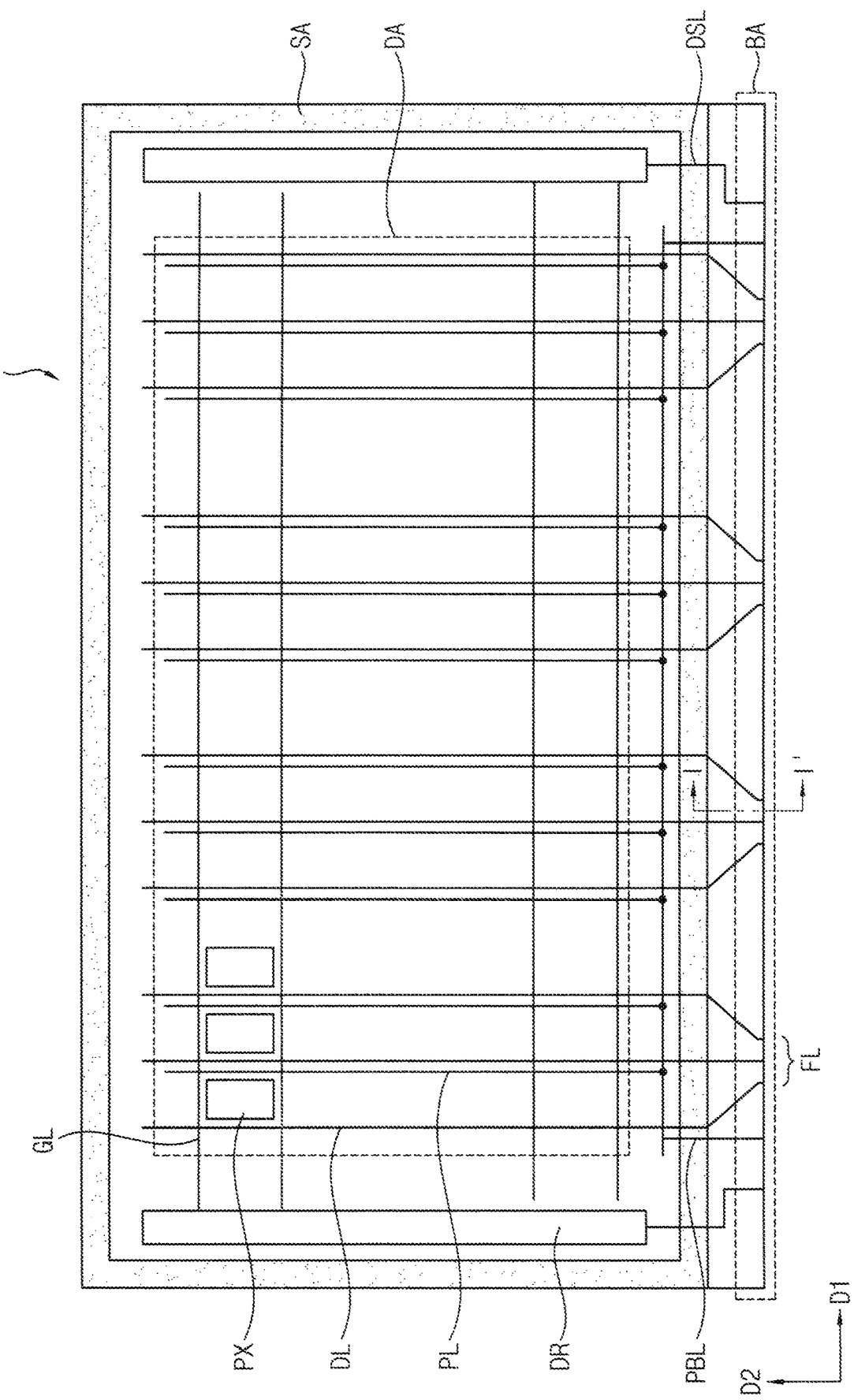
FIG. 1 is a top plan view illustrating an embodiment of a display device.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being related to another element such as being "on" another element, it can be directly on the other element or intervening elements may be present therebetween. In contrast, when an element is referred to as being related to another element such as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross-section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

According to a conventional method for a convention display device, a driving chip or a flexible printed circuit board, on which the driving chip is mounted, is bonded to an upper surface of a substrate of a display panel of the display device. A planar area at which the driving chip is bonded to the display panel may undesirably increase a bezel of the display device.

A display device and a method for manufacturing a display device according to embodiments of the invention will be described hereinafter with reference to the accompanying drawings, in which some embodiments are shown.

Figure 2:
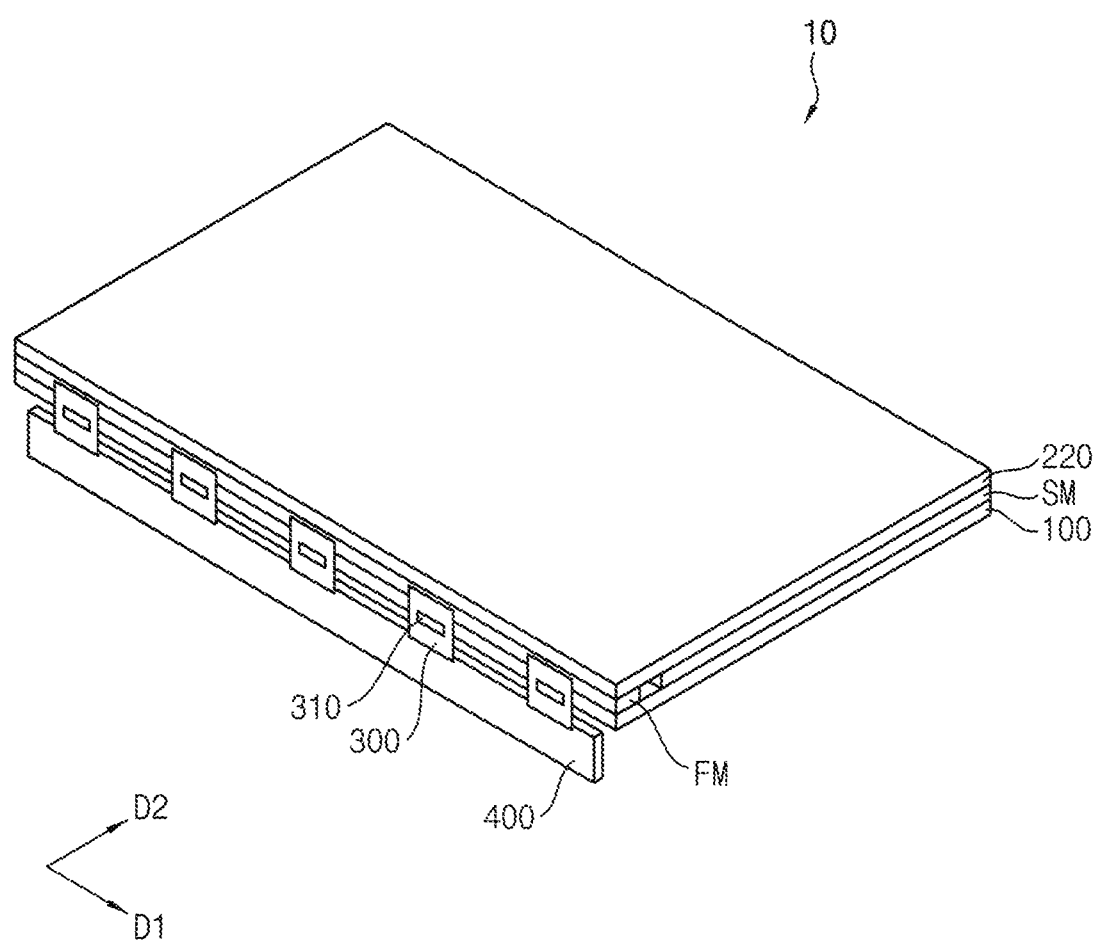
FIG. 2 is a perspective view illustrating an embodiment of a display device.

FIG. 1 is a top plan view illustrating an embodiment of a display device. FIG. 2 is a perspective view illustrating an embodiment of a display device.

Referring to FIGS. 1 and 2, a display device 10 includes a display area DA and a peripheral area which surrounds the display area DA. In the display area DA, a light may be generated and/or emitted, or a transmittance of a light provided by an external light source may be adjusted, to display an image. The peripheral area may be defined as an area at which an image is not displayed, while the display area DA is an area at which the image is displayed. The peripheral area is adjacent to the display area DA.

In an embodiment, the display device 10 may be an organic light-emitting display device. In an embodiment, for example, a pixel PX may be provided in plurality in an array (e.g., an array of pixels PX or pixels PX). The pixel PX may include a light-emitting element may be disposed in the display area DA to generate and/or emit a light in response to a driving signal (e.g., an electrical signal) which is applied or transmitted to the pixel PX. The display device 10 may include a display panel having a display area DA, a peripheral area and pixels PX corresponding to those of the display device 10. The following elements may be included within the display panel, without being limited thereto.

A signal wiring and a power wiring may be disposed in the display area DA as a conductive wire through which an electrical signal is transmitted, to respectively transfer a driving signal and a power as electrical signals, to the pixels PX. In an embodiment, for example, a gate line GL, a data line DL and a power line PL may be disposed as conductive wires within the display area DA. The gate line GL may lengthwise extend along a first direction D1 and may provide a gate signal as an electrical signal to the pixels PX. The data line DL may lengthwise extend along a second direction D2 crossing the first direction D1 and may provide a data signal as another electrical signal to the pixels PX. The power line PL may lengthwise extend along the second direction D2 and may provide a power (e.g., an electrical power, voltage, etc.) to the pixels PX.

A thickness of the display device 10, the display panel and/or various components of these components, is defined along a third direction crossing both of the first direction D1 and the second direction D2.

A transfer wiring TL, a circuit part or the like may be disposed in the peripheral area. The transfer wiring TL may extend into or be connected to the display area DA, to transfer a driving signal or a power signal to the display area DA. The circuit part may generate a driving signal. The circuit part may be connected to the display area DA. In an embodiment, for example, a driver DR as a circuit part which generates a gate signal, may be disposed in the peripheral area. A control signal wiring DSL transferring a control signal to the driver DR, a fan-out wiring FL transferring a data signal to the data line DL, a power bus wiring PBL transferring a power to the power line PL or the like, as a transfer wiring TL, may be disposed in the peripheral area.

In an embodiment, the peripheral area includes a sealing area SA in which a sealing member SM is disposed. The sealing area SA may have a shape surrounding the display area DA in the top plan view.

In an embodiment, within the display panel, the transfer wiring TL may extend to a side end of the peripheral area. An end of the transfer wiring TL is electrically connected to a side terminal SC of the display panel. The side terminal SC is electrically connected to an external driving device which is external to the display panel. Thus, within the display device 10, the transfer wiring TL may be electrically connected to the external driving device to receive a driving signal, a control signal, a power or the like from the external driving device.

A bonding area BA may be defined by a planar area in which a side terminal SC provided in plurality (e.g., side terminals SC) are disposed. In an embodiment, for example, the side terminals SC may be arranged along the first direction D1 in the bonding area BA. A filling member FM covering the side terminals SC may be disposed in the bonding area BA.

In an embodiment, the external driving device is bonded to a side surface of the display panel. The display panel may include the bonding area BA, the side terminals SC and the filling member FM described above.

In an embodiment, for example, as illustrated in FIG. 2, the display device 10 may include an array substrate 100, a cover substrate 220 facing and combined with the array substrate 100, a sealing member SM disposed between the array substrate 100 and the cover substrate 220, and the filling member FM disposed between the array substrate 100 and the cover substrate 220. The filling member FM may lengthwise extend along the first direction D1, e.g., a direction along which the side terminals SC are arranged.

A side surface of the side terminal SC or a side pad CP connected to the side terminal SC, is exposed at a side surface of the display panel. Thus, the external driving device may be bonded to the side surface of the display panel to be electrically connected to the transfer wiring TL. An upper surface of the side terminal SC may be covered by a protective layer 182 or the filling member FM. Thus, a contact surface of the side terminal SC and the side pad CP may be substantially defined by an exposed side surface of the side terminal SC. That is, the contact surface of the side terminal SC and the side pad CP may be defined solely by a side surface of the side terminal SC which is exposed outside the display panel at the side surface thereof. The side surface which is exposed may be defined by a side surface of a conductive layer (e.g., a conductive side surface) which is exposed to outside the display panel.

In an embodiment, for example, the external driving device may include a flexible printed circuit board 300 on which or to which a driving chip 310 is mounted, and a printed circuit board 400 electrically connected to the flexible printed circuit board 300. The driving chip 310 may transfer a data signal to the transfer wiring TL of the display panel, through the flexible printed circuit board 300. The printed circuit board 400 may transfer a control signal, a power or the like to the transfer wiring TL of the display panel, through flexible printed circuit board 300.

Figure 3:
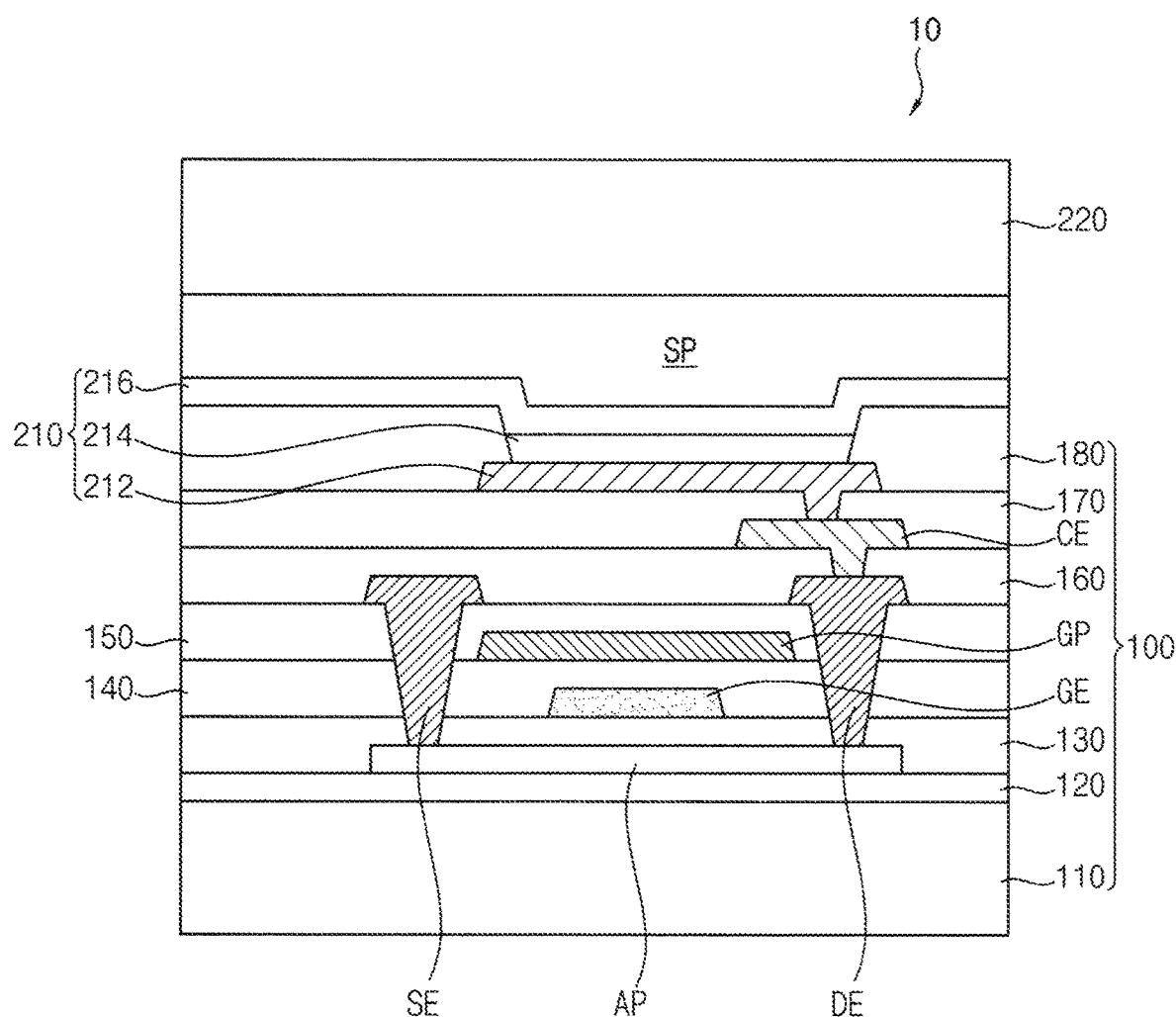
FIG. 3 is an enlarged cross-sectional view illustrating an embodiment of a display device.

FIG. 3 is an enlarged cross-sectional view illustrating an embodiment of a display device 10. FIG. 3 may represent an enlarged cross-sectional view of the display panel of the display device 10, such as at the display area DA.

Referring to FIG. 3, a unit of the pixel PX disposed in the display area DA may include a driving element disposed on a base substrate 110, and a light-emitting element electrically connected to the driving element. In an embodiment, the light-emitting element may be an organic light-emitting diode 210. The light-emitting element may be driven or controlled by the driving element to generate and/or emit light for displaying an image. The driving element may include at least one thin film transistor.

A buffer layer 120 may be disposed on the base substrate 110. An active pattern AP may be disposed on the buffer layer 120.

In an embodiment, for example, the base substrate 110 may include glass, quartz, sapphire, a polymeric material or the like. In an embodiment, the base substrate 110 may include a transparent and relatively rigid material such as glass.

The buffer layer 120 may prevent or reduce permeation of impurities, humidity or external gas from outside the base substrate 110, and may planarize an upper surface of the base substrate 110. In an embodiment, for example, the buffer layer 120 may include an inorganic material such as oxide, nitride or the like.

A gate electrode GE of the driving element may be disposed on the active pattern AP. A first insulation layer 130 may be disposed between the active pattern AP and the gate electrode GE.

A gate wiring pattern GP may be disposed on the gate electrode GE. The gate wiring pattern GP may include a capacitor electrode which forms a portion of a capacitor, a wiring for transferring various signals or the like.

A second insulation layer 140 may be disposed between the gate electrode GE and the gate wiring pattern GP. A third insulation layer 150 may be disposed on the gate wiring pattern GP.

In an embodiment, for example, the active pattern AP may include silicon or a metal oxide semiconductor. In an embodiment, the active pattern AP may include polycrystalline silicon (polysilicon), which may be doped with n-type impurities or p-type impurities.

In another embodiment or in another transistor that is not illustrated in FIG. 3, an active pattern AP may include a metal oxide semiconductor. In an embodiment, for example, the active pattern AP may include two-component compound (ABx), ternary compound (ABxCy) or four-component compound (ABxCyDz), which contains indium (In), zinc (Zn), gallium (Ga), tin (Sn), titanium (Ti), aluminum (Al), hafnium (Hf), zirconium (Zr), magnesium (Mg). In an embodiment, for example, the active pattern AP may include zinc oxide (ZnOx), gallium oxide (GaOx), titanium oxide (TiOx), tin oxide (SnOx), indium oxide (InOx), indium-gallium oxide ("IGO"), indium-zinc oxide ("IZO"), indium tin oxide ("ITO"), gallium zinc oxide ("GZO"), zinc magnesium oxide ("ZMO"), zinc tin oxide ("ZTO"), zinc zirconium oxide (ZnZrxOy), indium-gallium-zinc oxide "(IGZO"), indium-zinc-tin oxide ("IZTO"), indium-gallium-hafnium oxide ("IGHO"), tin-aluminum-zinc oxide ("TAZO"), indium-gallium-tin oxide ("IGTO") or the like.

The first insulation layer 130, the second insulation layer 140 and the third insulation layer 150 may include silicon oxide, silicon nitride, silicon carbide or a combination thereof. Furthermore, the first insulation layer 130, the second insulation layer 140 and the third insulation layer 150 may include an insulating metal oxide such as aluminum oxide, tantalum oxide, hafnium oxide, zirconium oxide, titanium oxide or the like. In an embodiment, for example, the first insulation layer 130, the second insulation layer 140 and the third insulation layer 150 may have a single-layered structure or a multiple-layered structure along a thickness direction of the base substrate 110 (e.g., along a vertical direction in FIG. 3), including silicon nitride and/or silicon oxide, respectively, or may have different structures from each other. As used herein, a "multiple-layered structure" or stacked structure is taken along a thickness direction of the base substrate 110.

The gate electrode GE and the gate wiring pattern GP may include a metal, a metal alloy, a metal nitride, a conductive metal oxide or the like. In an embodiment, for example, the gate electrode GE and the gate wiring pattern GP may include gold (Au), silver (Ag), aluminum (Al), copper (Cu), nickel (Ni), platinum (Pt), magnesium (Mg), chromium (Cr), tungsten (W), molybdenum (Mo), titanium (Ti), tantalum (Ta) or an alloy thereof, and may have a single-layered structure or a multiple-layered structure including different metal layers.

A first source metal pattern may be disposed on the third insulation layer 150. The first source metal pattern may include a source electrode SE and a drain electrode DE, which electrically contact the active pattern AP. The source electrode SE and the drain electrode DE may extend through the insulation layers disposed thereunder to contact the active pattern AP, respectively. In an embodiment, the active pattern AP, the gate electrode GE, the source electrode SE and the drain electrode DE, along with insulation layers and the gate wiring pattern GP, respectively therebetween, may together form a transistor.

A fourth insulation layer 160 may be disposed on the first source metal pattern. A second source metal pattern may be disposed on the fourth insulation layer 160. The second source metal pattern may include a connection electrode CE which electrically connects the drain electrode DE to an organic light-emitting diode 210 disposed thereon. In an embodiment, the second source metal pattern may further include a mesh-shape power line to reduce or effectively prevent voltage drop of a power applied to the organic light-emitting diode 210. The mesh-shape may be defined by solid portions spaced apart from each other along two directions, to define spaces therebetween. A fifth insulation layer 170 may be disposed on the second source metal pattern.

The first and second source metal patterns may include a metal, a metal alloy, a metal nitride, a conductive metal oxide or the like. In an embodiment, for example, the first and second source metal patterns may include gold (Au), silver (Ag), aluminum (Al), copper (Cu), nickel (Ni), platinum (Pt), magnesium (Mg), chromium (Cr), tungsten (W), molybdenum (Mo), titanium (Ti), tantalum (Ta) or an alloy thereof, and may have a single-layered structure or a multiple-layered structure including different metal layers. In an embodiment, the first and second source metal patterns may have a multiple-layered structure including an aluminum layer.

The fourth insulation layer 160 and the fifth insulation layer 170 may include an organic material. In an embodiment, for example, the fourth insulation layer 160 and the fifth insulation layer 170 may include an organic insulation material such as a phenol resin, an acryl resin, a polyimide resin, a polyamide resin, a silioxane resin, an epoxy resin or the like.

An organic light-emitting diode 210 may be disposed on the fifth insulation layer 170. The organic light-emitting diode 210 may include a first electrode 212 contacting the connection electrode CE, a light-emitting layer 214 disposed on the first electrode 212, and a second electrode 216 disposed on the light-emitting layer 214. The light-emitting layer 214 of the organic light-emitting diode 210 may be disposed at least in an opening of a pixel-defining layer 180 disposed on the fifth insulation layer 170. The first electrode 212 may be a lower electrode of the organic light-emitting diode 210, and the second electrode 216 may be an upper electrode of the organic light-emitting diode 210.

The first electrode 212 may function as an anode. In an embodiment, for example, the first electrode 212 may be a light transmitting electrode or a light reflecting electrode according to an emission type of the display device 10. When the first electrode 212 is a transmitting electrode, the first electrode 212 may include indium tin oxide, indium zinc oxide, zinc tin oxide, indium oxide, zinc oxide, tin oxide or the like. When the first electrode 212 is a reflecting electrode, the first electrode 212 may include gold (Au), silver (Ag), aluminum (Al), copper (Cu), nickel (Ni), platinum (Pt), magnesium (Mg), chromium (Cr), tungsten (W), molybdenum (Mo), titanium (Ti) or a combination thereof, and may have a stacked structure further including the material that may be used for the transmitting electrode.

The pixel-defining layer 180 defines the opening overlapping or corresponding to at least a portion of the first electrode 212. In an embodiment, for example, the pixel-defining layer 180 may include an organic insulating material.

The light-emitting layer 214 may include at least one of a hole injection layer ("HIL"), a hole transporting layer ("HTL"), an organic light-emitting layer, an electron transporting layer ("ETL") and an electron injection layer ("EIL"). In an embodiment, for example, the light-emitting layer 214 may include a relatively low molecular weight organic compound or a relatively high molecular weight organic compound.

In an embodiment, the light-emitting layer 214 may emit a red light, a green light or a blue light. In another embodiment, the light-emitting layer 214 may emit a white light. The light-emitting layer 214 emitting a white light may have a multiple-layered structure including a red-emitting layer, a green-emitting layer and a blue-emitting layer, or a single-layered structure including a mixture of a red-emitting material, a green-emitting material and a blue-emitting material.

The second electrode 216 may be a light transmitting electrode or a light reflecting electrode according to an emission type of the display device 10. In an embodiment, for example, the second electrode 216 may include a metal, a metal alloy, a metal nitride, a metal fluoride, a conductive metal oxide or a combination thereof.

In an embodiment, for example, the second electrode 216 may be a common layer extending continuously over a plurality of pixels PX within the display area DA to correspond to each of the pixel PX.

A cover substrate 220 is disposed on the organic light-emitting diode 210. In an embodiment, for example, the cover substrate 220 may include glass, quartz, sapphire, a polymeric material or the like. In an embodiment, the cover substrate 220 may include a transparent rigid material such as glass.

In an embodiment, for example, a spacer may be disposed under the cover substrate 220 to support the cover substrate 220. The spacer may be disposed between the cover substrate 220 and the organic light-emitting diode 210 or between the pixel-defining layer 180 and the second electrode 216 of the organic light-emitting diode 210.

A space SP between the cover substrate 220 and the organic light-emitting diode 210 may have a vacuum state or may be filled with a gas or a sealing member SM. The sealing member SM may include an organic layer, an inorganic layer or a combination thereof.

In another embodiment, a flexible polymer substrate may be used instead of the cover substrate 220 as a relatively rigid element, or the cover substrate 220 may be omitted. In an embodiment, for example, an encapsulation layer is provided or formed to cover the organic light-emitting diode 210, and a protective window of the display device 10 may be disposed on the encapsulation layer.

In an embodiment, the transfer wiring TL does not extend to the side surface of the display panel. Thus, the transfer wiring TL is spaced apart from the side surface of the display panel. The transfer wiring TL contacts the side terminal SC of the display panel, and the side terminal SC extends to the side surface of the display panel so that a portion of the side terminal SC is exposed to outside the display panel at the side surface of the display panel.

Figure 4:
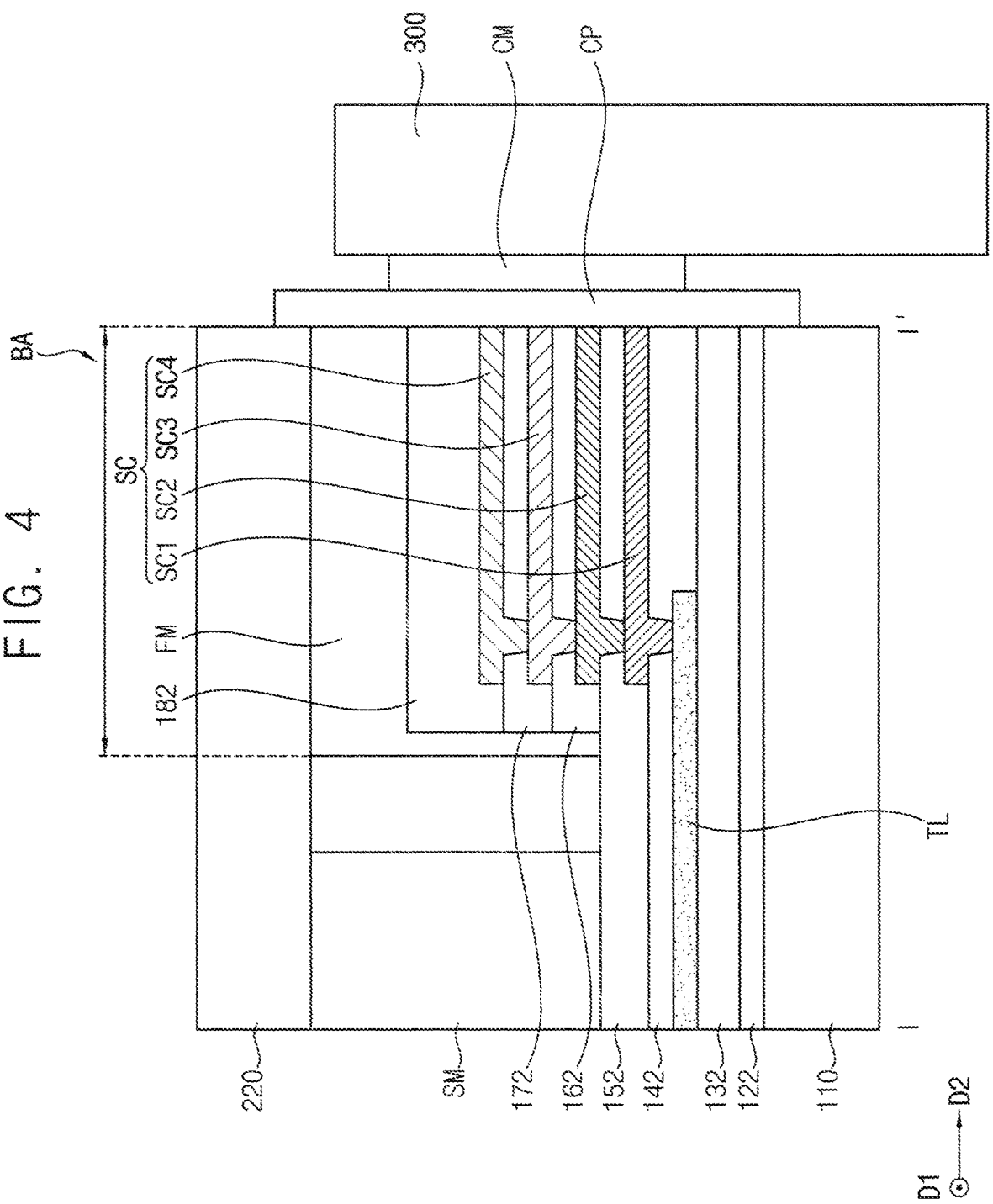
FIGS. 4, 6 and 7 are enlarged cross-sectional views illustrating embodiments of a bonding area of a display device.
Figure 5:
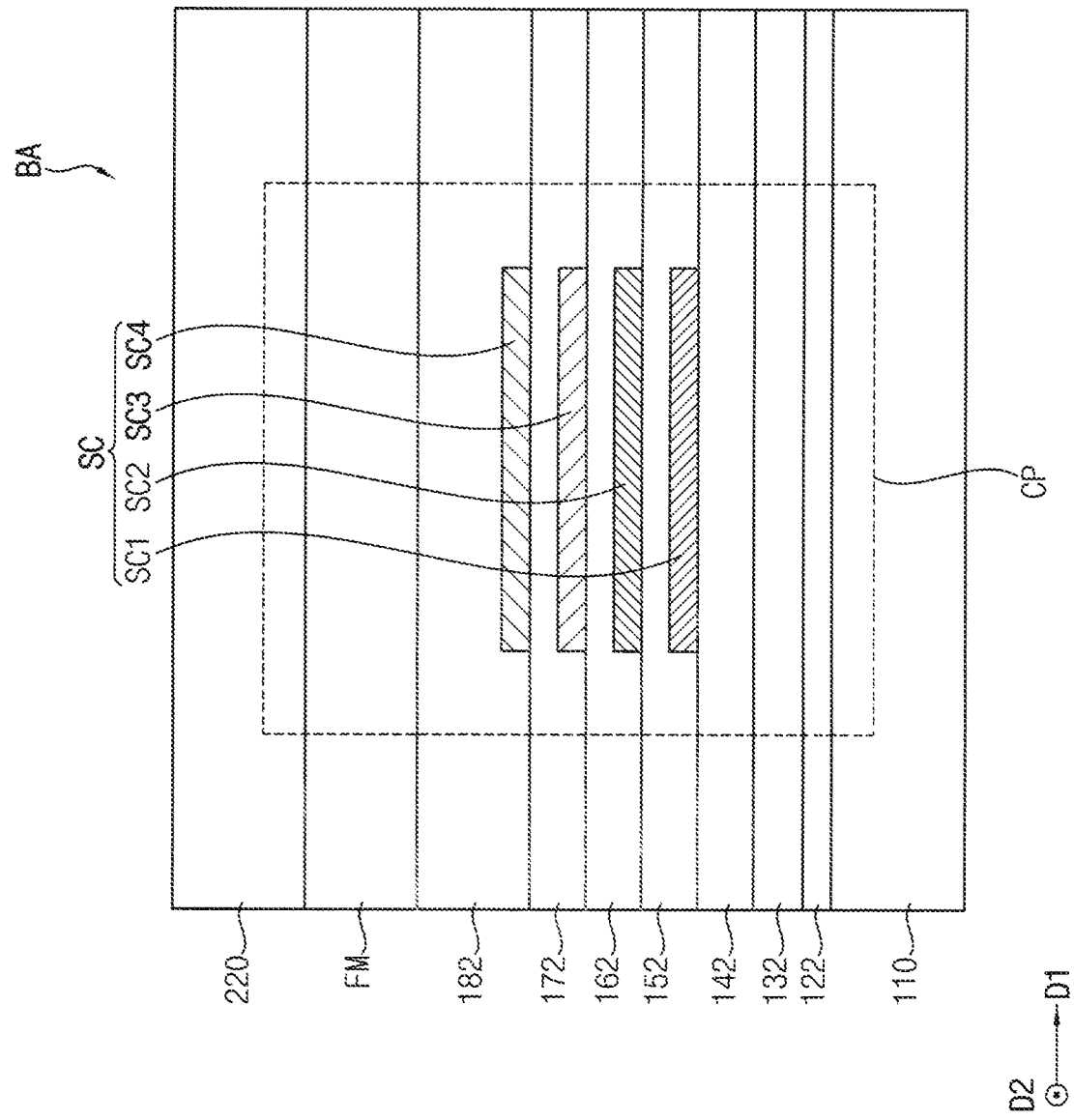
FIG. 5 is a lateral enlarged cross-sectional view of an embodiment of a display device.
Figure 6:
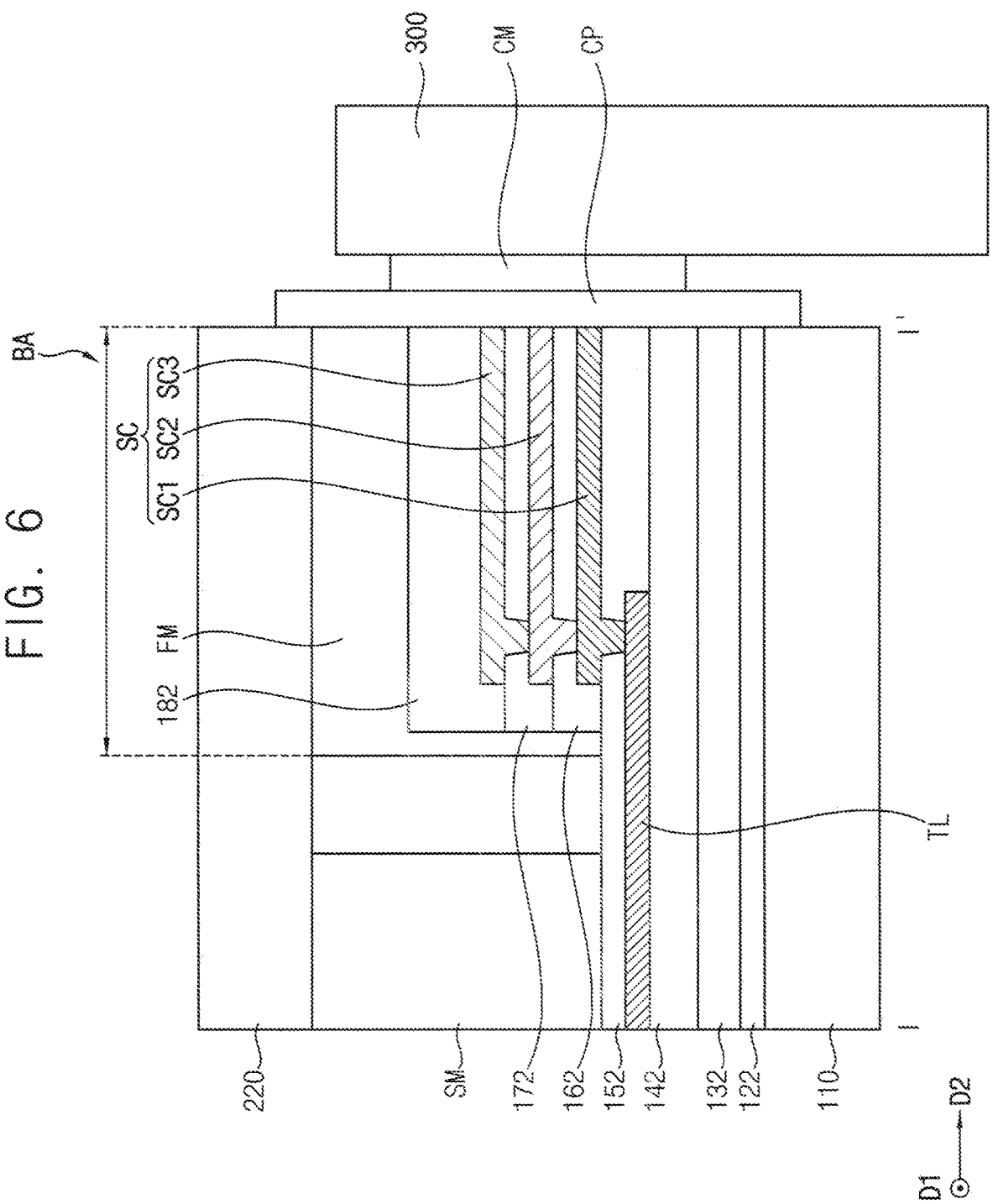
Figure 7:
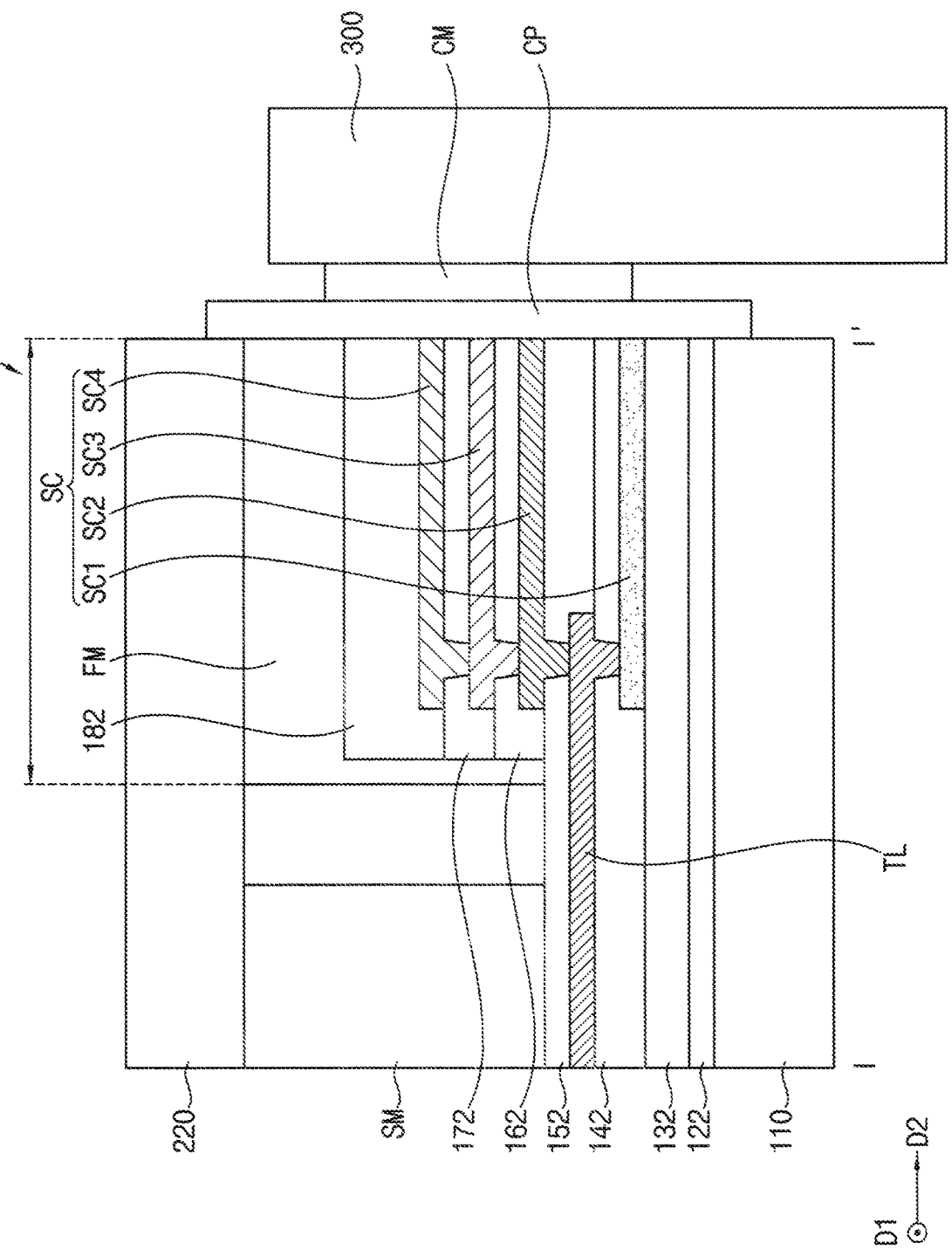

FIGS. 4, 6 and 7 are enlarged cross-sectional views illustrating embodiments of a bonding area BA of a display device 10. Particularly, FIGS. 4, 6 and 7 illustrate a cross-section taken along the line I-I' of FIG. 1. FIG. 5 is a lateral enlarged cross-sectional view of an embodiment of a display device 10. The views of FIGS. 4 to 7 may be views of the peripheral area, such as at an end portion of the display panel, at which side surfaces of one or more layers of the display panel are exposed outside thereof. The end portion of the display panel may include the bonding area BA and a remaining portion of the peripheral area extended from the bonding area BA to a boundary between the display area DA and the peripheral area (e.g., dotted line in FIG. 1).

Referring to FIGS. 3, 4 and 5, a transfer wiring TL may extend from the display area DA and toward a side surface of a display panel which is in a bonding area BA. A side surface of one or more layers of the display panel may define or correspond to the side surface of the display panel. In an embodiment, the transfer wiring TL may be a fan-out wiring FL. However, embodiments are not limited thereto. In an embodiment, for example, the transfer wiring TL may be a power bus wiring PBL, a control signal wiring or a bridge wiring, connected thereto.

A buffer layer 122 and a first insulation layer 132 may be disposed between the transfer wiring TL and the base substrate 110, in the bonding area BA. The buffer layer 122 and the first insulation layer 132 at the end portion of the display panel may be an extended portion of the buffer layer 120 and the first insulation layer 132 of the display area DA, respectively. The buffer layer 122 and the first insulation layer 132 in the peripheral area may be portions of a same material layer from which the buffer layer 120 and the first insulation layer 132 are respectively provided in a method of manufacturing the display device 10. As used herein, features being provided from a same material layer or provided as extended portions of each other, may be referred to as being "in a same layer" as each other.

In an embodiment, the transfer wiring TL in the peripheral area may be in a same layer as the gate electrode GE in the display area DA.

The side terminal SC electrically contacts the transfer wiring TL, and extends to a side surface of the display panel. In an embodiment, the side terminal SC may be disposed in a different layer from the transfer wiring TL, and may have a multiple-layered structure.

In an embodiment, for example, the side terminal SC may include a first conductive layer SC1 disposed on the transfer wiring TL, a second conductive layer SC2 disposed on the first conductive layer SC1, a third conductive layer SC3 disposed on the second conductive layer SC2 and a fourth conductive layer SC4 disposed on the third conductive layer SC3. However, embodiments are not limited thereto. In an embodiment, for example, the side terminal SC may include at least one conductive layer, such as at least two conductive layers to increase a contact area of the side terminal SC, with respect to a component disposed outside the display panel. Referring to FIG. 4, for example, the first conductive layer SC1 of the side terminal SC forms an interface with the transfer wiring TL, and the second conductive layer SC2 of the side terminal SC forms an interface with the first conductive layer SC1.

In an embodiment, the first conductive layer SC1 may be in a same layer as the gate wiring pattern GP of the display area DA. The second conductive layer SC2 may be in a same layer as the first source metal pattern of the display area DA. The third conductive layer SC3 may be in a same layer as the second source metal pattern of the display area DA. The fourth conductive layer SC4 may be in a same layer as the first electrode 212 of the organic light-emitting diode 210 of the display area DA.

In an embodiment, for example, a second insulation layer 142 may be disposed between the first conductive layer SC1 and the transfer wiring TL, a third insulation layer 152 may be disposed between the first conductive layer SC1 and the second conductive layer SC2, a fourth insulation layer 162 may be disposed between the second conductive layer SC2 and the third conductive layer SC3, and a fifth insulation layer 172 may be disposed between the third conductive layer SC3 and the fourth conductive layer SC4.

Each of the conductive layers may be electrically connected to the transfer wiring TL. In an embodiment, for example, the first conductive layer SC1 may pass through a thickness of the second insulation layer 142 to contact the transfer wiring TL, the second conductive layer SC2 may pass through a thickness of the third insulation layer 152 to contact the first conductive layer SC1, the third conductive layer SC3 may pass through a thickness of the fourth insulation layer 162 to contact the second conductive layer SC2, and the fourth conductive layer SC4 may pass through a thickness of the fifth insulation layer 172 to contact the third conductive layer SC3.

The second insulation layer 142, the third insulation layer 152, the fourth insulation layer 162 and the fifth insulation layer 172 of the peripheral area may be an extended portion of the second insulation layer 140, the third insulation layer 150, the fourth insulation layer 160 and the fifth insulation layer 170 of the display area DA, respectively. The second insulation layer 142, the third insulation layer 152, the fourth insulation layer 162 and the fifth insulation layer 172 of the peripheral area may be portions of a same material layer from which the second insulation layer 140, the third insulation layer 150, the fourth insulation layer 160 and the fifth insulation layer 170 is respectively provided in a method of manufacturing the display device 10.

At least one of the buffer layer 122, the first insulation layer 132, second insulation layer 142, the third insulation layer 152, the fourth insulation layer 162 and the fifth insulation layer 172 may be partially or entirely removed in an area corresponding to the sealing member SM and/or the bonding area BA. In an embodiment, for example, one or more insulation layer including an organic material may be omitted under the sealing member SM.

A protective layer 182 may be provided or formed on the fourth conductive layer SC4. The protective layer 182 in the peripheral area may be in a same layer as the pixel-defining layer 180 of the display area DA.

In an embodiment, a filling member FM is disposed between the fourth conductive layer SC4 and the cover substrate 220. The filling member FM may fill a space between the side terminal SC and the cover substrate 220 in the bonding area BA to reduce or effectively prevent damage to the sealing member SM by a grinding process or a polishing process, or contamination by particles generated by the grinding process or the polishing process.

In an embodiment, for example, the filling member FM may include a cured resin such as silicone resin, an epoxy resin, a phenol resin or the like. Furthermore, the filling member FM may be provided or formed from a glass frit similar to the providing of the sealing member SM.

FIG. 4 illustrates that the filling member FM is spaced apart from the sealing member SM along the second direction D2 to dispose a space between the filling member FM and the sealing member SM. However, embodiments are not limited thereto. In an embodiment, for example, the filling member FM may contact or may be connected to the sealing member SM, such as to occupy an entirety or a portion of the space shown in FIG. 4.

A side pad CP contacting the side terminal SC is disposed on the side surface of the display panel. In an embodiment, for example, the side pad CP may extend along a vertical direction (e.g., a thickness direction) to cover at least a portion of a side surface of the base substrate 110 or the cover substrate 220.

The side pad CP may include a conductive material such as a metal. In an embodiment, for example, a metal layer may be provided or formed by depositing a metal material such as gold (Au), silver (Ag), aluminum (Al), copper (Cu), nickel (Ni), platinum (Pt), magnesium (Mg), chromium (Cr), tungsten (W), molybdenum (Mo), titanium (Ti), tantalum (Ta) or the like. The metal layer may be patterned, for example, by laser, to form the side pad CP. However, embodiments are not limited thereto. In an embodiment, for example, a metal pattern may be directly formed on the display panel such as by using a mask having an opening with which the side pad CP is provided.

An end (e.g., a distal end or a terminal end) of the transfer wiring TL may be spaced apart from the side surface of the display panel. In an embodiment, for example, the end of the transfer wiring TL may be spaced apart along the second direction D2 from an end of the base substrate 110, or the contact surface of the side terminal SC and the side pad CP.

The contact surface of the side terminal SC may include a collection of side surfaces of layers within the side terminal SC, such as the conductive layers therein, without being limited thereto. Referring to FIG. 5, for example, a total of the planar areas of the side surfaces of the conductive layers of the side terminal SC may define a total contact area of the side terminal SC and/or a total contact area of the side pad CP. A planar area of the side pad CP (dotted line in FIG. 5) may be equal to or greater than a total contact area of the side terminal SC, without being limited thereto.

The side pad CP may be bonded to a flexible printed circuit board 300 by a conductive connection member CM.

The conductive connection member CM may be provided or formed by various methods. In an embodiment, for example, the conductive connection member CM may be an anisotropic conductive film ("ACF") having conductive particles dispersed therein. In another embodiment, the conductive connection member CM may be a conductive bump bonded to the side pad CP, for example, by supersonic welding or the like. However, embodiments are not limited thereto, and various conventional boding methods may be used for bonding the side pad CP to the flexible printed circuit board 300 to each other and for providing or forming the conductive connection member CM.

According to embodiments, a side surface of a display panel is exposed to outside the display panel, and is bonded to an external driving device, thereby reducing a size of a peripheral area or a bezel of the display panel and/or the display device 10.

Furthermore, a transfer wiring TL in the display panel is not exposed to outside the display panel at the side surface thereof, and is electrically connected to a side pad CP through a side terminal SC. Thus, damage to the transfer wiring TL, which may be caused in processing the side surface of the display panel, may be reduced or effectively prevented.

Furthermore, since the side terminal SC includes a plurality of conductive layers, a contact area of the side terminal SC at which the side terminal SC is in electrical contact with the side pad CP, may be increased.

A configuration of a side terminal SC may be changed depending on a configuration of a transfer wiring TL. In an embodiment, for example, referring to FIG. 6, a transfer wiring TL may be disposed in a same layer as a gate wiring pattern GP.

When the transfer wiring TL is disposed in a same layer as the gate wiring pattern GP, a side terminal SC may include a first conductive layer SC1 disposed on the transfer wiring TL, a second conductive layer SC2 disposed on the first conductive layer SC1 and a third conductive layer SC3 disposed on the second conductive layer SC2.

The first conductive layer SC1 may be in a same layer as the first source metal pattern of the display area DA. The second conductive layer SC2 may be in a same layer as the second source metal pattern of the display area DA. The third conductive layer SC3 may be in a same layer as the first electrode 212 of the organic light-emitting diode 210 of the display area DA.

Referring to FIG. 7, when the transfer wiring TL is disposed in a same layer as the gate wiring pattern GP, a side terminal SC may include a first conductive layer SC1 disposed under the transfer wiring TL, a second conductive layer SC2 disposed on the transfer wiring TL, a third conductive layer SC3 disposed on the second conductive layer SC2 and a fourth conductive layer SC4 disposed on the third conductive layer SC3.

The first conductive layer SC1 may be in a same layer as the gate electrode GE of the display area DA. The second conductive layer SC2 may be in a same layer as the first source metal pattern of the display area DA. The third conductive layer SC3 may be in a same layer as the second source metal pattern of the display area DA. The fourth conductive layer SC4 may be in a same layer as the first electrode 212 of the organic light-emitting diode 210 of the display area DA.

The first conductive layer SC1 and the second conductive layer SC2 may contact the transfer wiring TL.

FIGS. 8 to 11 are enlarged cross-sectional views illustrating an embodiment of a method for manufacturing a display device. FIGS. 8 to 11 may illustrate a cross-section of a bonding area BA.

Figure 8:
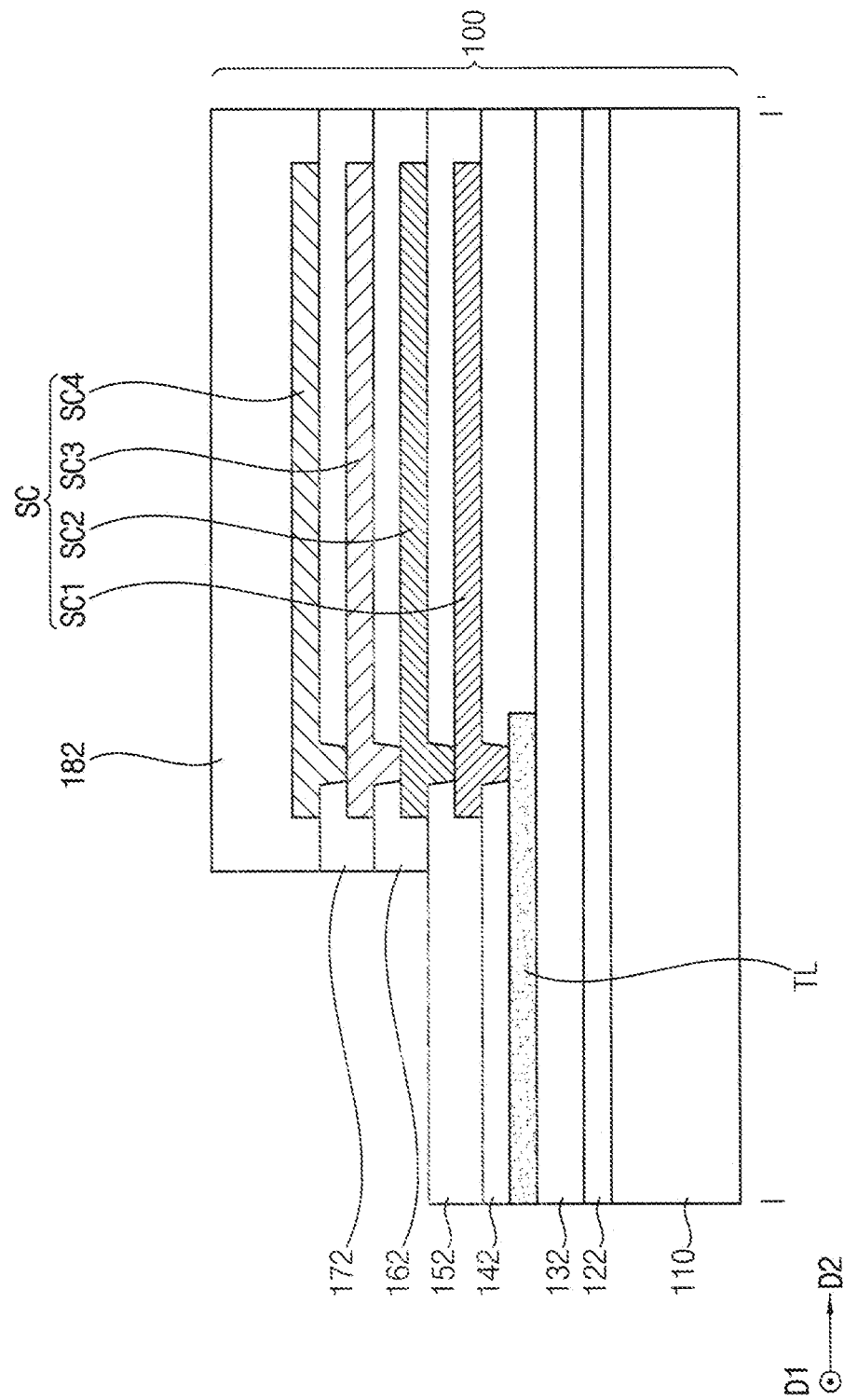
FIGS. 8 to 11 are enlarged cross-sectional views illustrating an embodiment of a method for manufacturing a display device.

Referring to FIG. 8, a buffer layer 122 is provided or formed on a base substrate 110. A first insulation layer 132 is provided or formed on the buffer layer 122. A transfer wiring TL is provided or formed on the first insulation layer 132. A second insulation layer 142 is provided or formed on the transfer wiring TL. A first conductive layer SC1 contacting the transfer wiring TL is provided or formed on the second insulation layer 142. A third insulation layer 152 is provided or formed on the first conductive layer SC1. A second conductive layer SC2 contacting the first conductive layer SC1 is provided or formed on the third insulation layer 152. A fourth insulation layer 162 is provided or formed on the second conductive layer SC2. A third conductive layer SC3 contacting the second conductive layer SC2 is provided or formed on the fourth insulation layer 162. A fifth insulation layer 172 is provided or formed on the third conductive layer SC3. A fourth conductive layer SC4 contacting the third conductive layer SC3 is provided or formed on the fifth insulation layer 172. A protective layer 182 is provided or formed on the fourth conductive layer SC4.

Each of the conductive layers may otherwise be referred to as a conductive pattern. Such pattern may be a discrete pattern. Taking FIGS. 4, 5 and 8 together, for example, each of the conductive patterns has a discrete dimension in both the first direction D1, the second direction D2 and the thickness direction (e.g., vertical direction). In FIG. 8, the insulation layer and the protective layer 182 each extend further than ends of the conductive patterns at a side corresponding to the side surface of the display panel (e.g., at end I'). The structure in FIG. 8 may form a preliminary structure of the display panel. The display panel of the display device 10 may be defined by the preliminary structure which is processed as described below.

The insulation layers, the conductive layers and the protective layer 182 in the peripheral area may be provided or formed in and by the process of forming the driving element and the organic light-emitting diode 210 in the display area DA. At least one of the insulation layers may be omitted.

The structure including the base substrate 110, a pixel array (e.g., an array of pixels PX) provided or formed in the display area DA of the base substrate 110 and the bonding structure provided or formed in the peripheral area including the bonding area BA may be referred as an array substrate 100.

Figure 9:
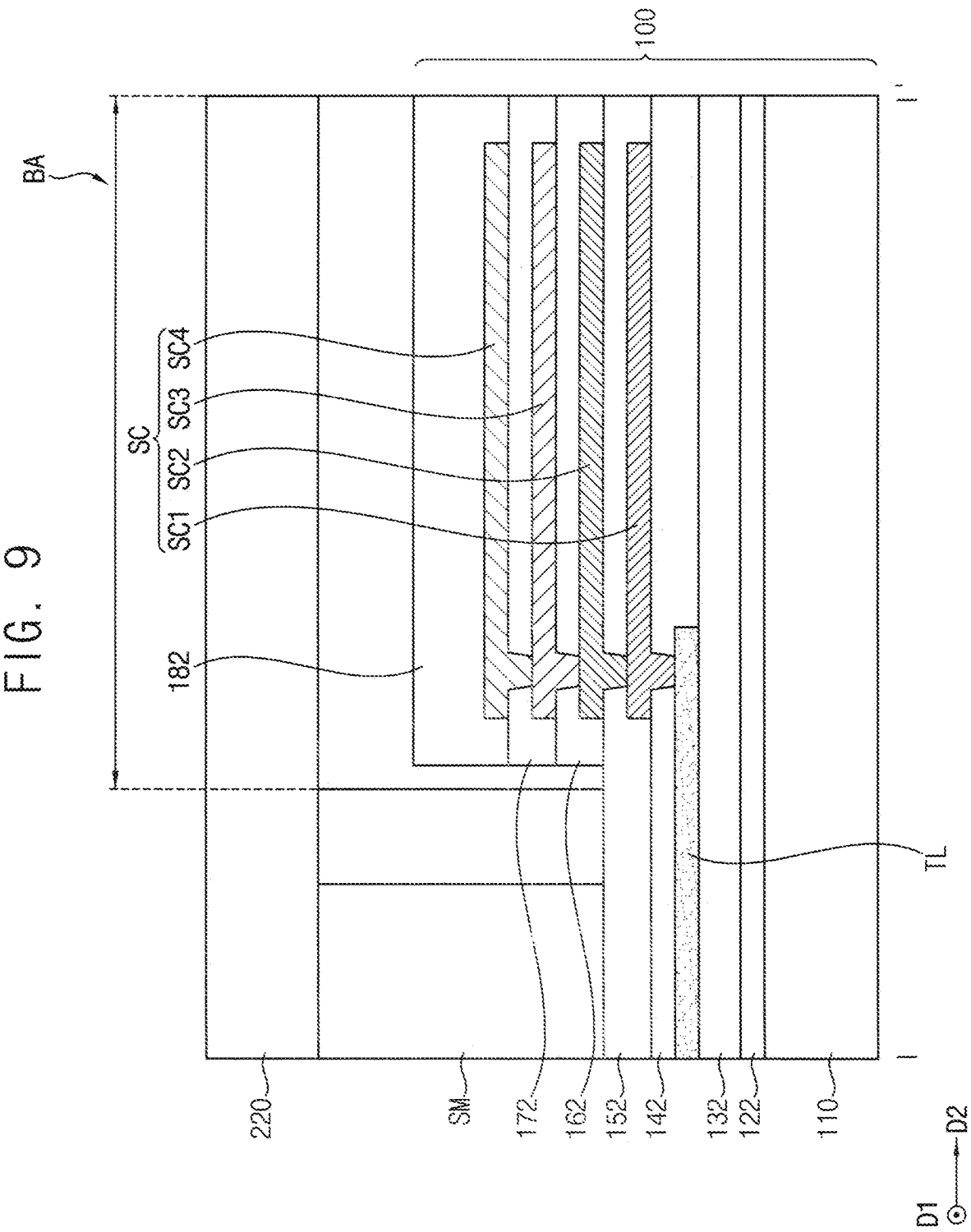

Referring to FIG. 9, a cover substrate 220 is provided on the array substrate 100. A sealing member SM may be provided or formed between the cover substrate 220 and the array substrate 100 to combine the cover substrate 220 with the array substrate 100 and to encapsulate the pixel array in the display area DA. The structure in FIG. 9 may form a preliminary structure of the display panel. The display panel of the display device 10 may be defined by the preliminary structure which is further processed as described below.

In an embodiment, for example, the sealing member SM may be provided or formed from a curable polymeric resin or a glass frit. In an embodiment, a glass frit may be coated on a sealing area SA, the cover substrate 220 may disposed on the glass frit, and the glass frit is cured by heat, ultraviolet ("UV") light ray, laser or the like to form the sealing member SM in the sealing area SA.

A filling member FM may be disposed between the side terminal SC and the cover substrate 220.

In an embodiment, the filling member FM may be provided or formed by injecting and curing a polymeric resin between the array substrate 100 and the cover substrate 220 after the array substrate 100 and the cover substrate 220 are combined with each other.

In another embodiment, before or after a glass frit is provided on the sealing area SA of the array substrate 100, a curable polymeric resin may be coated on the bonding area BA of the array substrate 100. Thereafter, the cover substrate 220 is disposed on the glass frit and the curable polymeric resin, and the glass frit and the curable polymeric resin are cured to form the sealing member SM and the filling member FM.

In another embodiment, the filling member FM may be provided or formed from a glass frit, along with the forming of the sealing member SM.

Figure 10:
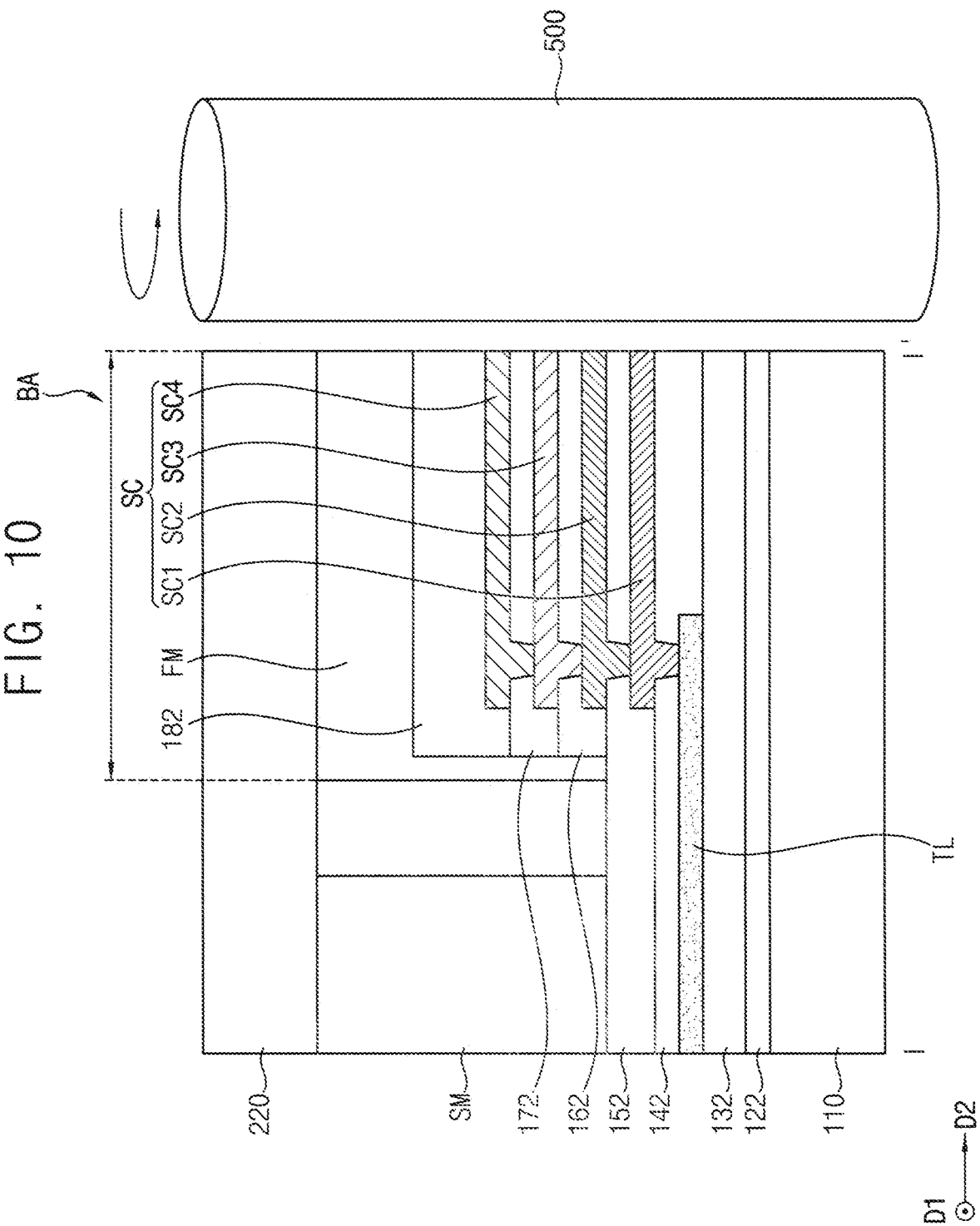

Referring to FIG. 10, the display panel including the array substrate 100 and the cover substrate 220 coupled to each other in a preliminary structure of the display panel, is further processed to expose a side surface of the side terminal SC to outside the display panel.

In an embodiment, processing the side surface of the display panel may include scribing the display panel, grinding layers of the preliminary structure which are disposed at the side surface of the display panel, polishing the side surface of the display panel or a combination thereof, for exposing the side surface of the display panel.

A processing member 500 for processing the side surface of the display panel and exposing the side surface thereof to outside the display panel, may include a scribing machine, a grinder, a polishing machine or the like.

In FIG. 10, in exposing the side surface of the display panel to outside thereof, portions of each of the insulation layers, the filling member FM and the protective layer 182 which previously extended further than ends of the conductive patterns at the side surface of the display panel, are removed. In an embodiment, the processing the side surface of the preliminary structure may dispose end surfaces of each of the insulation layers, the filling member FM and the protective layer 182 coplanar with each other, without being limited thereto.

Figure 11:
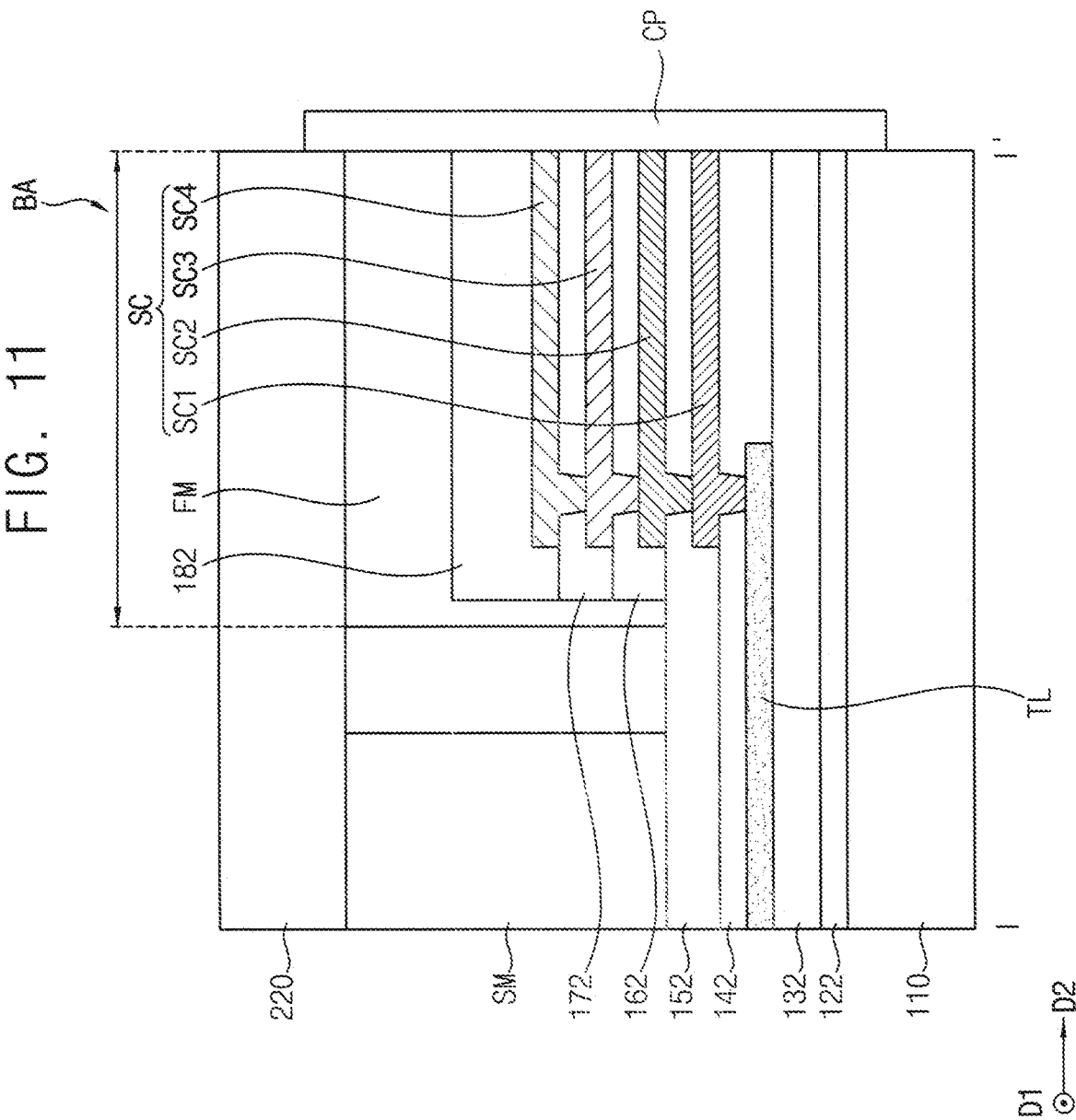

Referring to FIG. 11, the end surfaces of the insulation layers, the filling member FM and the protective layer 182 are each exposed outside the display panel, by the processing of the side surface of the preliminary structure. That is, the side terminal SC is exposed to outside the display panel. A side pad CP is provided or formed on a side surface of the display panel at which the side terminal SC is exposed. A side surface of the display panel may include a collection of the end surfaces of the insulation layers, the filling member FM and the protective layer 182, without being limited thereto.

In an embodiment, for example, a metal material layer is provided or formed on the side surface of the display panel by a deposition process such as a sputtering process. The metal material layer is patterned to form the side pad CP.

Thereafter, as illustrated in FIG. 4, the side pad CP is combined with an external driving device by an anisotropic conductive film, supersonic welding or the like. As a result, the external driving device may be electrically connected to the transfer wiring TL through the side terminal SC exposed to outside the display panel and the side pad CP connected thereto.

Figure 12:
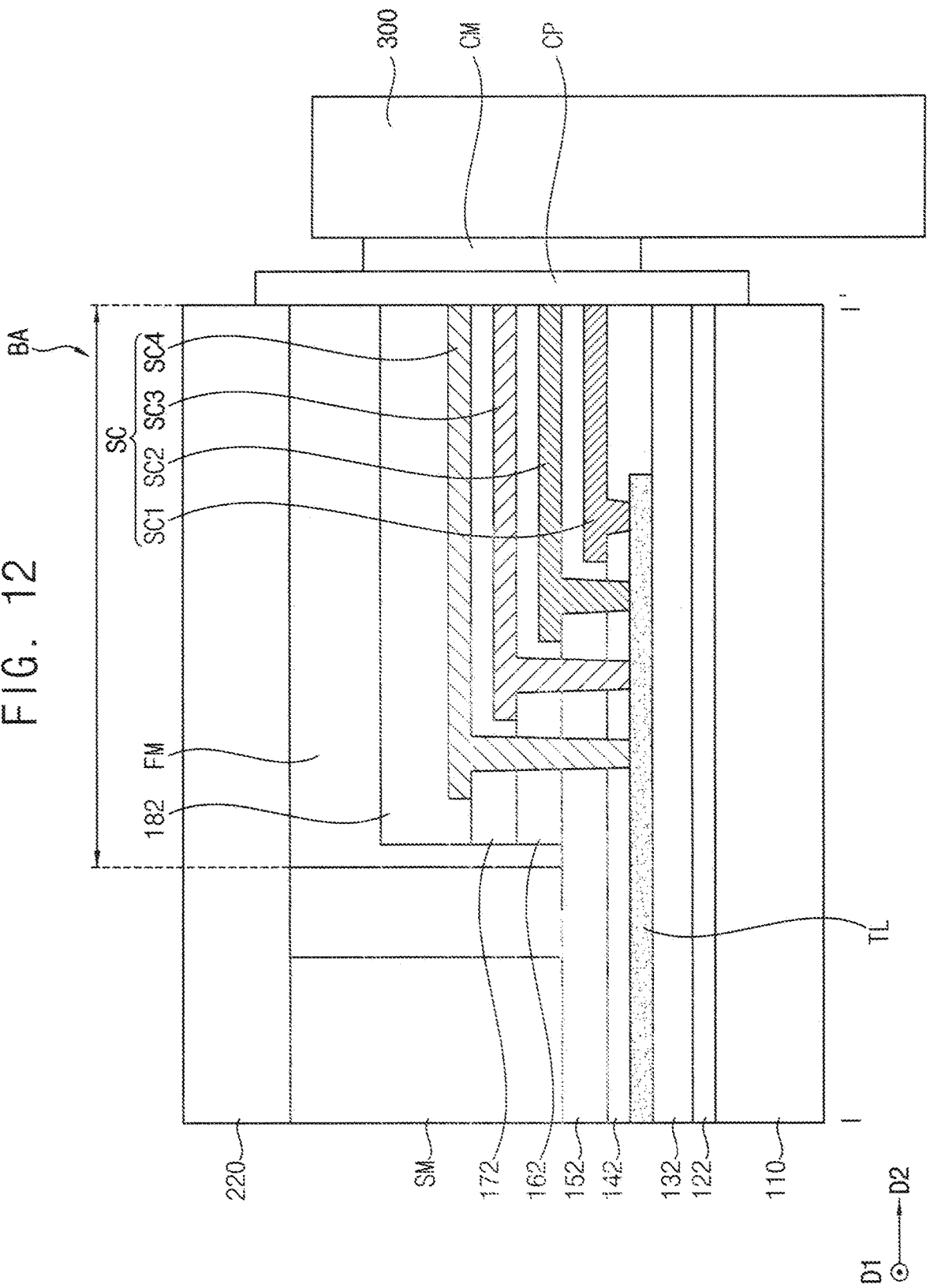
FIGS. 12 and 13 are enlarged cross-sectional views illustrating embodiments of a bonding area of a display device.
Figure 13:
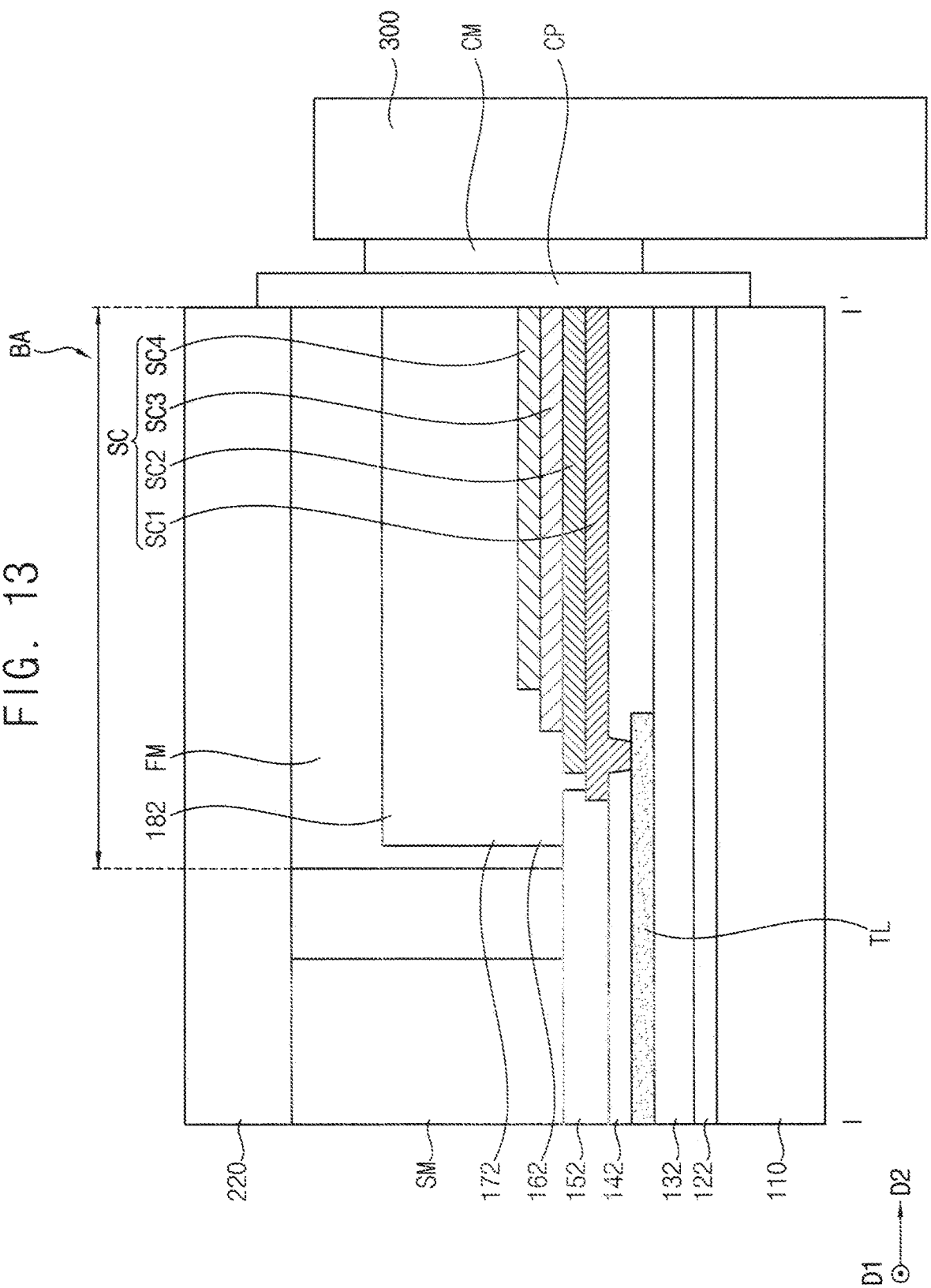

FIGS. 12 and 13 are enlarged cross-sectional views illustrating embodiments of a bonding area BA of a display device 10.

Referring to FIG. 12, a side terminal SC is disposed in a bonding area BA. A transfer wiring TL is electrically connected to the side terminal SC.

In an embodiment, for example, the side terminal SC includes a first conductive layer SC1 disposed on the transfer wiring TL, a second conductive layer SC2 disposed on the first conductive layer SC1, a third conductive layer SC3 disposed on the second conductive layer SC2 and a fourth conductive layer SC4 disposed on the third conductive layer SC3.

In an embodiment, at least two of the conductive layers may contact the transfer wiring TL, to define more than one contact area of the side terminal SC with the transfer wiring TL. In an embodiment, for example, each of the first to fourth conductive layers SC1, SC2, SC3 and SC4 may contact the transfer wiring TL, to define four contact areas of the side terminal SC with the transfer wiring TL.

The above configuration may reduce electrical contact resistance between the side terminal SC and the transfer wiring TL.

Furthermore, as illustrated in FIG. 13, insulation layers between the conductive layers may be removed or omitted. In an embodiment, for example, one or more of the conductive layers may contact each other to form an interface therebetween (e.g., a contact area). The conductive layers between which insulation layers are omitted, may be connected to the transfer wiring TL at a single contact area of the side terminal SC with respect to the transfer wiring TL, without being limited thereto.

FIGS. 14 and 15 are lateral enlarged cross-sectional views illustrating embodiments of a bonding area BA of a display device 10. FIGS. 14 and 15 may illustrate a view of an exposed side surface of a side terminal SC, which is a contact surface of the side terminal SC with a side pad CP.

Referring to FIG. 14, on the side surface of the display panel at which the side pad CP contacts the side terminal SC, the side terminal SC may include a first conductive layer SC1, a second conductive layer SC2 disposed on the first conductive layer SC1, a third conductive layer SC3 disposed on the second conductive layer SC2, and a fourth conductive layer SC4 disposed on the third conductive layer SC3.

End surfaces of the conductive layers define the side surface of the side terminal SC and respectively include a horizontal extending portion extending along the base substrate 110, such as in a plane defined by the first direction D1 and the second direction D2 (e.g., a planar direction). Referring to FIG. 14, the end surface of at least one of the conductive layers may include a vertical extending portion extending along a vertical direction (e.g., a thickness direction). In an embodiment, for example, the vertical extending portion may extend along a side surface of an insulation layer adjacent thereto.

Referring to FIG. 14, for example, the first conductive layer SC1 may include a horizontal extending portion SC1a extending along a horizontal direction and a vertical extending portion SC1b passing through a second insulation layer 142, a first insulation layer 132 and a buffer layer 122, which are disposed under the horizontal extending portion SC1a. The second conductive layer SC2 may include a horizontal extending portion SC2a extending along a horizontal direction and a vertical extending portion SC2b passing through a third insulation layer 152 disposed under the horizontal extending portion SC2a. The third conductive layer SC3 may include a horizontal extending portion SC3a extending along a horizontal direction and a vertical extending portion SC3b passing through a fourth insulation layer 162 disposed under the horizontal extending portion SC3a. The fourth conductive layer SC4 may include a horizontal extending portion SC4a extending along a horizontal direction and a vertical extending portion SC4b passing through a fifth insulation layer 172 disposed under the horizontal extending portion SC4a.

The conductive layers may form multiple contact areas with each other, along the first direction D1, as illustrated in FIG. 14, without being limited thereto. At the side surface of the display panel, a contact area or contact surface of the side pad CP and the side terminal SC is defined by one or more of the horizontal extending portions and the vertical extending portions described above. That is, a contact surface of the side pad CP and the side terminal SC is defined by a planar area of the side surface of the side terminal SC conductive portions which are exposed to outside the display panel.

Furthermore, as illustrated FIG. 15, an opening may be provided or formed through a buffer layer 122, a first insulation layer 132 and a second insulation layer 142. The opening may be a single opening which is common to each of the aforementioned layers. A first conductive layer SC1 may have a conformal shape extending along the opening at a bottom surface defined by the base substrate 110 and along a side surface collectively defined by sidewalls of the buffer layer 122, the first insulation layer 132 and the second insulation layer 142. Furthermore, a second conductive layer SC2, a third conductive layer SC3 and a fourth conductive layer SC4 disposed on the first conductive layer SC1 may have a conformal shape extending along an upper surface and a side surface of the first conductive layer SC1. At the side surface of the display panel, a contact area or contact surface of the side pad CP and the side terminal SC is defined by the conformal shape or profile which extends along a bottom of the opening and a side surface of an insulating layer at the opening described above. That is, a contact surface of the side pad CP and the side terminal SC is defined by a planar area of the side surface of the side terminal SC conductive portions which are exposed to outside the display panel. In an embodiment, the side surface of the side terminal SC which is exposed to outside the display panel includes a conformal conductive portion which extends along a bottom of the opening and along a sidewall of an insulation layer at the opening defined thereby.

As illustrated in FIGS. 14 and 15, the side terminal SC may have or define portions thereof extending along a horizontal direction and a vertical direction. Thus, a contact area between conductive layers may be increased thereby reducing a contact resistance within the side terminal SC and increasing connection reliability thereof. Within a conductive layer, one of a horizontal direction portion and a vertical direction may be considered an extended portion of the other of the horizontal direction portion and the vertical direction portion.

The above embodiments provides an organic light-emitting display device. However, embodiments are not limited thereto. In another embodiment, for example, embodiments may be applied for a bonding structure of display devices such as a liquid crystal display device, an electroluminescent display device, a micro light-emitting diode ("LED") display device or the like.

Embodiments may be applied to various display devices. In an embodiment, for example, embodiments may be applied to vehicle-display device, a ship-display device, an aircraft-display device, portable communication devices, display devices for display or for information transfer, a medical-display device, etc.

The foregoing is illustrative of embodiments and is not to be construed as limiting thereof. Although embodiments have been described, those skilled in the art will readily appreciate that many modifications are possible in the embodiments without materially departing from the novel teachings of the invention. Accordingly, all such modifications are intended to be included within the scope of the invention. Therefore, it is to be understood that the foregoing is illustrative of various embodiments and is not to be construed as limited to the specific embodiments disclosed, and that modifications to the disclosed embodiments, as well as other embodiments, are intended to be included within the scope of the invention, as set forth in the following claims and equivalents thereof.

What is claimed is:

1. A display device comprising:
  a display panel including:
    a pixel array;
    a side terminal including a side surface which is exposed to outside the display panel;
    a transfer wiring electrically connecting the side terminal and the pixel array to each other;
    an end of the transfer wiring which is closest to and spaced apart from the side surface of the side terminal; and
    a contact area between the transfer wiring and the side terminal is spaced apart from the end of the transfer wiring; and
  a side pad which is conductive and through which an electrical signal is provided to the side terminal from outside the display panel, the side pad contacting the display panel at the side surface of the side terminal which is exposed to outside the display panel.

2. The display device of claim 1, wherein the side terminal includes at least two conductive layers.

3. The display device of claim 2, wherein the side terminal includes arranged along a thickness direction of the display device, a first conductive layer and a second conductive layer.

4. The display device of claim 3, wherein
  the first conductive layer of the side terminal forms an interface with the transfer wiring, and
  the second conductive layer of the side terminal forms an interface with the first conductive layer.

5. The display device of claim 3, wherein
  each of the two conductive layers is exposed to outside the display panel at an end surface thereof, to define the side surface of the side terminal, and
  each of the first conductive layer and the second conductive layer which is exposed to outside the display panel, forms an interface with the transfer wiring which electrically connects the side terminal and the pixel array to each other.

6. The display device of claim 2, wherein
  the side terminal includes arranged along a thickness direction of the display device, a first conductive layer and a second conductive layer, and
  along the thickness direction of the display device, the transfer wiring is between the first conductive layer and the second conductive layer.

7. The display device of claim 2, further comprising an insulation layer adjacent to the side terminal,
  wherein an end surface of each of the two conductive layers is exposed to outside the display panel to define the side surface of the side terminal, the end surface including:
    a horizontal extending portion extending along a plane defined by a first direction and a second direction crossing each other and exposed to outside the display panel, and
    a vertical extending portion extending along a thickness direction of the display device which is defined by a third direction crossing each of the first and second directions, the vertical extending portion extending from the horizontal extending portion and through the insulation layer and exposed to outside the display panel.

8. The display device of claim 2, further comprising an insulation layer adjacent to the side terminal and in which a single opening is defined,
  wherein
    at the single opening, an end surface of each of the two conductive layers is exposed to outside the display panel to define the side surface of the side terminal, and
    the end surfaces of the two conductive layers which are exposed to outside the display panel together define a conformal shape extending along a bottom of the single opening and along a side surface of the insulation layer which defines the single opening.

9. The display device of claim 1, wherein the display panel further includes:
  an array substrate including each of the pixel array, the side terminal and the transfer wiring, on a base substrate;
  a cover substrate facing the array substrate;
  a sealing member which combines the array substrate and the cover substrate to each other and encapsulates the pixel array; and
  a filling member disposed between the cover substrate and the side terminal.

10. The display device of claim 9, wherein the filling member includes a cured resin.

11. The display device of claim 1, further comprising an external driving device connected to the side pad and from which the electrical signal is provided from outside the display panel to the side pad.

12. The display device of claim 11, wherein the external driving device includes a flexible printed circuit board on which a driving chip is mounted.

13. The display device of claim 11, wherein the pixel array includes an organic light-emitting diode.

* * * * *